United States Patent [19]
Tokuda

[11] 3,986,056
[45] Oct. 12, 1976

[54] CIRCUIT FOR TRANSFORMING A TRIGGER SIGNAL INTO A PULSE

[75] Inventor: Kazuo Tokuda, Tokyo, Japan

[73] Assignee: Nippon Electric Company, Ltd., Tokyo, Japan

[22] Filed: Apr. 9, 1975

[21] Appl. No.: 566,473

[30] Foreign Application Priority Data
Apr. 10, 1974 Japan............................ 49-41360

[52] U.S. Cl. .............................. 307/273; 307/254; 307/265
[51] Int. Cl.² ..................................... H03K 17/00
[58] Field of Search .......... 307/273, 253, 254, 265; 330/30 D; 328/207

[56] References Cited
UNITED STATES PATENTS

| | | | |
|---|---|---|---|
| 2,975,300 | 3/1961 | Haugen et al...................... | 307/273 |
| 3,114,049 | 12/1963 | Blair................................. | 307/273 |
| 3,183,368 | 5/1965 | Ross.................................. | 307/273 |
| 3,887,823 | 6/1975 | Nikami.............................. | 307/273 |

*Primary Examiner*—Stanley D. Miller, Jr.
*Attorney, Agent, or Firm*—Sughrue, Rothwell, Mion, Zinn, and Macpeak

[57] ABSTRACT

A pulse generating circuit which normally draws no current in the absence of a trigger pulse is disclosed. The circuit generates a pulse having a constant width independent of temperature or power supply voltage variations in response to a trigger pulse. The pulse width is determined by an RC time constant and the ratio of a resistive voltage divider.

6 Claims, 2 Drawing Figures

CIRCUIT FOR TRANSFORMING A TRIGGER SIGNAL INTO A PULSE

BACKGROUND OF THE INVENTION

The present invention relates to a circuit for transforming a trigger signal into a pulse signal which has a predetermined constant pulse width.

For obtaining a direct-current voltage from an input signal, the input signal is conventionally transformed into a rectangular pulse by monostable multivibrator, and then the direct current voltage is generated from the rectangular pulse. The conventional monostable multivibrator is constructed of a pair of transistors the bases of which are respectively cross-connected to the collectors of the different transistors via an RC circuit. The pulse width of the output rectangular pulse depends on the time constant of the an RC circuit, the voltage of power supply and the base-emitter voltages and the collector-emitter saturation voltages of the transistors. The temperature fluctuation of the base-emitter voltage and the collector-emitter saturation voltage and variation of the power supply voltage cause considerable variation of the pulse width. Therefore the conventional monostable multivibrator is not suitable as a signal detector or frequency controller when a directcurrent voltage to be precisely respondent to the frequency of the input signal is needed.

Further, the conventional monostable multivibrator consumes large power, because either one or the other of the two transistors always allows the current to flow.

SUMMARY OF THE INVENTION

The principal object of this invention is therefore to provide a circuit for generating a pulse having a constant pulse width independent of temperature, in response to an input signal.

The circuit of the present invention comprises an input terminal for receiving an input signal, a first transistor having input, output and common electrodes and being turned on in response to the input signal, an output terminal coupled with the output electrode of the first transistor, a first resistive element having one end connected to the output terminal, a second resistive element having one end connected to the other end of the first resistive element, a power source supplying a voltage between the common electrode of the first transistor and the other end of the second resistive element, a second transistor having an input electrode connected to the other end of the first resistive element, a common electrode coupled with the other end of the second resistive element by way of an impedance element, and an output electrode feeding a current into the input electrode of the first transistor to hold the conductive state of the first transistor turned on by the input signal, a capacitive element having one end connected to the other end of the second resistive element, a third resistive element connected between the capacitive element and the output terminal, and a third transistor having a common electrode connected to the common electrode of the second transistor, an input electrode connected to the other end of the capacitive element and an output electrode connected to the output terminal.

According to the present invention, the pulse width depends on the time constant determined by the capacitive element and the third resistive element and the ratio of the resistance value of the first resistive element to that of the second resistive element and is not affected by the temperature variation of the environment or the voltage change of the power source.

BRIEF DESCRIPTION OF THE DRAWING

The present invention will be described in greater detail by reference to the drawings in which.

DESCRIPTION OF THE PREFERRED EMBODIMENT

Figure 1:
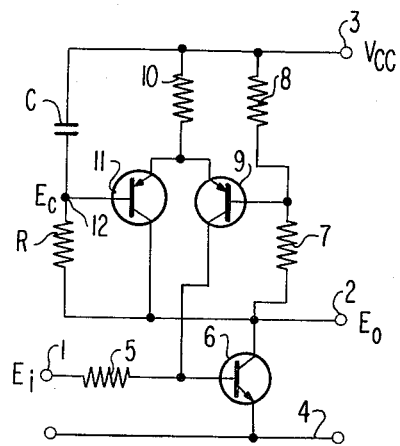
FIG. 1 is a circuit diagram showing the preferred embodiment of the present invention.

Referring now to FIG. 1, the most preferable embodiment of the invention includes one NPN transistor 6 and two PNP transistors 9 and 11, the emitters of which are connected in common. An input signal Ei is applied to the input terminal 1 and then fed to the base of the transistor 6 through a resistor 5. The purpose of the resistor 5 is to adjust the quantity of the collector current of transistor 9 being shunted to the side of input signal source, as well as to prevent the input current to the transistor 6 from becoming excessive. The emitter of the transistor 6 is grounded by being connected to the ground line 4. An output terminal 2 is connected to the collector of the transistor 6, and the output signal Eo is derived from the terminal 2. The positive electrode of a power source Vcc is connected to the power supply terminal 3. Resistors 7 and 8 are connected between the output terminal 2 and the power supply terminal 3. At the junction point of the resistors 7 and 8 is connected the base of the PNP transistor 9, the collector of which is connected to the base of the transistor 6 and the emitter to the power supply terminal 3 through the resistor 10. The other transistor 11 is connected with the transistor 9 so that the pair of these transistors 9 and 11 may operate as a differential amplifier. The collector of the transistor 11 is connected to the output terminal 2. A capacitor C is connected between the power supply terminal 3 and the base of the transistor 11, and a resistor R is connected between the base of the transistor 11 and the output terminal 2. The symbol $E_c$ denotes the signal at the junction point 12 between the capacitor C and the resistor R.

Figure 2:
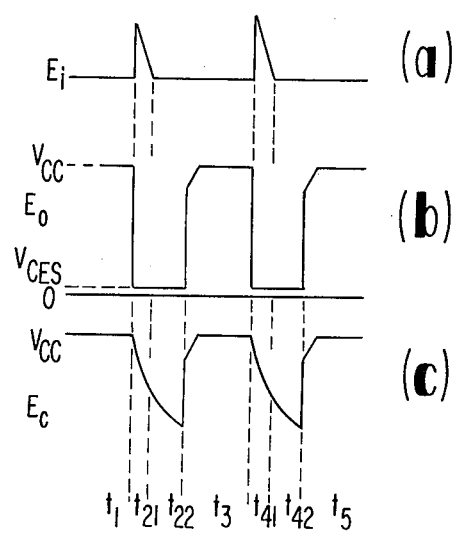
FIGS. 2(a) and 2(b) show waveforms of input and output signals.
FIG. 2(c) shows a waveform at the base of transistor 11 shown in FIG. 1.

Assume that during the time period $t_1$ shown in FIG. 2(a) no trigger pulse is applied to the input terminal 1. In this state, all the transistors 6, 9 and 11 are cut off and the output terminal 2 stands at the same potential as the power source voltage $V_{CC}$ as shown in FIG. 2(b), with the circuit being in a stable state. While, when a trigger pulse as shown in FIG. 2(a) is applied to the input terminal 1, at the time periods $t_{21}$ and $t_{41}$, the transistor 6 becomes conducting and saturated to allow collector current to flow through resistors 7 and 8. As a result, the potential at the output terminal 2 is lowered to the collector-emitter saturation voltage $V_{CES}$ of the transistor 6 as shown in FIG. 2(b), and the transistor 9 is turned on to maintain the base current of the transistor 6. On the other hand, the transistor 11 remains in the off state even if a trigger pulse is applied to the input terminal 1, as long as the potential at the junction point 12 is below a given value. Since nearly the same voltage as that of the power source is supplied across the RC circuit of the capacitor C and the resistor R when the transistor 6 is in conducting state, the voltage at the base of the transistor 11 gradually decreases as shown in FIG. 2(c) during the time periods $t_{21}$, $t_{22}$, $t_{41}$ and $t_{42}$. The decreasing voltage at the junction point 12 follows the so-called integral waveforms having the time constant RC. The transistor 11 turns on to cause its emitter current to start flowing when the charging voltage $E_C$ becomes equal to the potential drop across the resistor 8. Then, due to current switching action effected in the differential amplifier circuit, the collector current of the transistor 9 decreases to lower the quantity of base current to the transistor 6, thereby reducing the collector current of the transistor 6 to turn the transistor 6 off. As a result, the output voltage at the output terminal 2 rises to the power source voltage $V_{CC}$ to cause the transistors 9 and 11 to go into their cutoff states simultaneously. Consequently, the voltage charged across the capacitor C is discharged through the resistor R and the base and emitter electrodes of transistor 11. Thereafter, the stable state is restored from the quasi-stable state as shown in FIGS. 2(b) and 2(c) during the time periods $t_3$ and $t_5$.

As described above, an output square pulse having a given pulse width which depends on the value of the time constant of the RC circuit consisting of capacitor C and resistor R and on the ratio of voltage division due to resistors 7 and 8 is produced at the output terminal 2 synchronously with the trigger pulse applied to the input terminal 1. The pulse width of the output square pulse at the output terminal 2 is kept constant irrespective of the base-emitter voltage $V_{BE}$ and free of variations in the power source voltage $V_{CC}$ and the collector-emitter saturation voltage $V_{CES}$. The resistances of the resistors 7 and 8 have very small temperature dependence. On the other hand, the above base-emitter voltage $V_{BE}$ and the collector-emitter saturation voltage $V_{CES}$ are largely changed by the temperature fluctuation, while the power source voltage $V_{CC}$ is affected by the load impedance thereof or the load impedance of the circuit shown in FIG. 1. In other words, the pulse width of the output pulse $E_o$ of the circuit shown in FIG. 1 is not affected by temperature fluctuation or the voltage deviation of the power source from the predetermind value.

Further, small power consumption can be achieved because no current flows in the circuit at the time of no input trigger signal.

The NPN and PNP transistors used in the foregoing circuit may be interchanged with each other with changing the polarity of the power source. It is apparent that this modification will not affect the functions of the circuit in any respect, excepting the polarity of the output pulse is inverted.

What is claimed is:

1. A circuit for transforming a trigger signal into a pulse comprising:
    an input terminal for receiving a trigger signal;
    a first transistor having input, output and common electrodes, said input electrode being electrically coupled to said input terminal;
    an output terminal coupled with said output electrode of said first transistor;
    a first resistive element having one end connected to said output terminal;
    a second resistive element having one end connected to the other end of said first resistive element;
    a power source supplying a voltage between said common electrode of said first transistor and the other end of said second resistive element;
    a second transistor having input, output and common electrodes, the input electrode of said second transistor being connected to the junction point of said first and second resistive elements, and the output electrode of said second transistor being coupled with the input electrode of said first transistor so that a current is supplied to said input electrode of said first transistor to hold the conductive state of said first transistor when said first transistor is turned to the conductive state by said input signal;
    an impedance element connected between said other end of said second resistive element and said common electrode of said second transistor;
    a capacitive element having one end connected to said other end of said second resistive element;
    a third resistive element connected between the other end of said capacitive element and said output terminal; and
    a third transistor having input, output and common electrodes, the input electrode of said third transistor being connected to the junction point of said capacitive element and said third resistive element, said output electrode of said third transistor being connected to said output terminal, and said common electrode of said third transistor being connected to said common electrode of said second transistor.

2. A circuit claimed in claim 1, wherein said input, output and common electrodes of said first, second, and third transistors are respectively base, collector and emitter of the respective transistors.

3. A circuit claimed in claim 2, wherein said first, second and third resistive element are resistors, and said impedance element is also a resistor.

4. A circuit claimed in claim 2, wherein said collector of said second transistor is connected to said base of said first transistor.

5. A circuit claimed in claim 2, further comprising a fourth resistive element connected between said base of said first transistor and said input terminal.

6. A circuit for transforming a trigger signal into a pulse comprising:
    an input terminal for receiving a trigger signal;
    a first transistor having input, ouput and common electrodes, said input electrode being electrically coupled to said input terminal, and said first transistor being turned to a conductive state in response to said trigger signal;
    an output terminal coupled with said output electrode of said first transistor;
    a first resistive element having one end connected to said output terminal;
    a second resistive element having one end connected to the other end of said first resistive element;
    a power source supplying a voltage between said common electrode of said first transistor and the other end of said second resistive element;
    a second transistor having input, output and common electrodes, the input electrode of said second transistor being connected to the junction of said first and second resistive elements, and the output electrode of second transistor being coupled to said input electrode of said first transistor so that a current is supplied to said input electrode of said first transistor to hold said conductive state of said first transistor during a period when said pulse is derived from said output terminal;
    an impedance element connected between said other end of said second resistive element and said common electrode of said second transistor;

a capacitive element having one end connected to said other end of said second resistive element;
a third resistive element connected between the other end of said capacitive element and said input terminal; and
a third transistor having input, output and common electrodes, the input electrode of said third transistor being connected to the junction point of said capacitive element and said third resistive element, said output electrode of said third transistor being connected to said output terminal, and said common electrode of said third transistor being connected to said common electrode of said second transistor.

* * * * *